United States Patent
Hammes et al.

(10) Patent No.: US 6,933,798 B2
(45) Date of Patent: Aug. 23, 2005

(54) TRIMMING METHOD AND TRIMMING DEVICE FOR A PLL CIRCUIT FOR TWO-POINT MODULATION

(75) Inventors: Markus Hammes, Dinslaken (DE); Stefan Van Waasen, Duisburg (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/646,175

(22) Filed: Aug. 22, 2003

(65) Prior Publication Data

US 2004/0036539 A1 Feb. 26, 2004

Related U.S. Application Data

(63) Continuation of application No. PCT/DE02/00727, filed on Feb. 20, 2002.

(30) Foreign Application Priority Data

Feb. 22, 2001 (DE) .......................................... 101 08 636

(51) Int. Cl.[7] ................................................ H03C 3/00
(52) U.S. Cl. ........................ 332/127; 332/128; 332/148; 375/376; 331/16; 455/113; 455/260
(58) Field of Search ............................ 331/16; 455/113, 455/260; 375/376; 332/148, 127, 128

(56) References Cited

U.S. PATENT DOCUMENTS

| | | | |
|---|---|---|---|
| 4,965,531 A | 10/1990 | Riley | ........................... 331/14 |
| 5,151,665 A | 9/1992 | Wentzler | ......................... 331/8 |
| 5,207,491 A | 5/1993 | Rottinghaus | .................. 331/16 |
| 5,483,203 A | 1/1996 | Rottinghaus | .................. 331/10 |
| 5,983,077 A * | 11/1999 | Dent | ............................ 455/44 |
| 6,008,703 A | 12/1999 | Perrott et al. | ................ 332/100 |
| 6,034,573 A | 3/2000 | Alderton | ...................... 332/125 |
| 6,044,124 A | 3/2000 | Monahan et al. | ............ 375/376 |
| 6,441,690 B1 | 8/2002 | Savelli et al. | .................. 331/14 |
| 6,515,553 B1 * | 2/2003 | Filiol et al. | .................. 332/127 |

FOREIGN PATENT DOCUMENTS

| | | |
|---|---|---|
| DE | 199 29 167 A1 | 12/2000 |
| EP | 0 961 412 A1 | 12/1999 |
| EP | 1 079 514 A1 | 2/2001 |
| GB | 2 344 006 A | 5/2000 |

* cited by examiner

Primary Examiner—Arnold Kinkead
(74) Attorney, Agent, or Firm—Laurence A. Greenberg; Werner H. Stemer; Ralph E. Locher

(57) ABSTRACT

In the case of a trimming method for a PLL circuit operating based on the principle of a two-point modulation, the PLL circuit is locked without any modulation being impressed and then an analog and a digital modulation signal are impressed into the locked PLL circuit. A signal that is characteristic of the PLL control error is tapped from the PLL circuit, and the modulation swing in the analog modulation signal is changed such that the characteristic signal has the same value as before the analog and digital modulation signals were impressed.

9 Claims, 3 Drawing Sheets

TRIMMING METHOD AND TRIMMING DEVICE FOR A PLL CIRCUIT FOR TWO-POINT MODULATION

CROSS-REFERENCE TO RELATED APPLICATION

This application is a continuation of copending International Application No. PCT/DE02/00727, filed Feb. 20, 2002, which designated the United States and was not published in English.

BACKGROUND OF THE INVENTION

Field of the Invention

The invention relates to a trimming method for a PLL (Phase Locked Loop) circuit operating on the basis of the principle of two-point modulation and also to such a PLL circuit designed for impressing an analog and a digital modulation signal.

A low-complexity implementation of a transmitter design for transceivers in mobile radio systems is provided by transmitters in which a PLL circuit is used as a frequency synthesizer and is used to provide frequency modulation and phase modulation for a radio frequency signal.

The modulation signal is normally impressed into the PLL circuit using a frequency divider arranged in the PL loop's feedback path. This involves using a digital modulation signal for continually reprogramming the digital frequency divider. This form of modulation, which is also called single-point modulation, is known in the prior art and is described in U.S. Pat. Nos. 4,965,531, 6,008,703 and 6,044,124, for example.

To achieve low noise in the PLL circuit, the circuit's bandwidth is designed to be much narrower than is required for transmitting the modulated data. For this reason, in addition to the purely digital modulation, analog modulation is used in order to compensate for the limited bandwidth. Simultaneously impressing a digital and an analog modulation signal into a PLL circuit is called two-point modulation.

Published German Patent Application DE 199 29 167 A1, which represents the closest prior art, describes a two-point modulator and a method for two-point phase or frequency modulation using a PLL circuit. In addition, a digital modulation signal used for programming the frequency divider is converted by a digital-analog converter into an analog modulation signal that is then injected into the PL loop at a summation point situated at a suitable location. The two modulation signals are superimposed on one another at the output of the PLL, and in this way a frequency-independent transfer response is obtained for the loop.

One difficulty with two-point modulation is that, besides the inphase synchronization, a high level of concurrence among the amplitudes of the two modulation signals used is required. Because of production tolerances in the components for analog modulation, however, variations always arise in the modulation gradient and in the modulation's amplitude level. For this reason, it is necessary to perform amplitude trimming between the analog and the digital modulation following production of the PLL circuit.

If it is additionally necessary to take into account temperature influences as well, such trimming needs to be performed again before every transmission operation.

A known method for trimming a PLL circuit involves impressing the two-point modulation on the circuit in the locked state and using an external test receiver to receive the transmitted signal, to demodulate it and to trim the digital and analog modulation signals on the basis of the demodulation result. On account of the nonlinear response of the element which produces oscillations (this is a voltage-controlled oscillator or VCO) in the PLL circuit with regard to the frequency as a function of the control voltage, this trimming needs to be performed for every channel, however, which, when there are a large number of channels, means a test period of corresponding length. In addition, the trimming information needs to be stored in a memory, and another drawback is that the influence of temperature changes is not taken into account in this method.

Another option is to receive and demodulate the signal produced by the PLL circuit using the reception part of the transceiver. However, this would require a complete second PLL circuit in the receiver, which significantly increases the circuit complexity disadvantageously.

SUMMARY OF THE INVENTION

It is accordingly an object of the invention to provide a PLL circuit designed for impressing an analog modulation signal and a digital modulation signal based on a two-point modulation and to provide a trimming method for a PLL circuit operating based on the principle of two-point modulation, which overcome the above-mentioned disadvantages of the prior art apparatus and methods of this general type.

In particular, an object of the invention to provide a trimming method for a PLL circuit operating on the basis of the principle of two-point modulation which allows rapid amplitude trimming with little complexity and which permits temperature influences to be taken into account. The object of the invention is also to provide a PLL circuit having a trimming unit that can be implemented with little complexity and that allows the amplitude of the modulation signals to be trimmed quickly and without any problems.

With the foregoing and other objects in view there is provided, in accordance with the invention, a method for amplitude trimming between an analog modulation signal and a digital modulation signal for a PLL circuit operating based on a two-point modulation. The method includes initially operating the PLL circuit without impressing any modulation, i.e. the PLL circuit is locked to a desired frequency. Next, an analog and a digital modulation signal are impressed into the locked PLL circuit. Provided that these signals do not have identical amplitudes (in this case, the modulation swings would already have been trimmed), this results in a PLL control error. A signal that is characteristic of the PLL control error is then tapped from the PLL circuit. The modulation swing in the analog modulation signal is then changed such that the signal that is characteristic of the PLL control error has the same value as before the analog and digital modulation signals were impressed.

With this type of trimming, the output signal produced by the PLL circuit is not demodulated, because trimming involves reverting to the signal that is characteristic of the control error in the PLL circuit. Accordingly, it is not necessary to provide an internal or external demodulator, which keeps down circuit complexity and achieves a high level of practicability for the inventive trimming method.

One advantageous exemplary embodiment of the inventive method is characterized in that the signal that is characteristic of the control error in the PLL circuit is a voltage signal that is tapped from the PLL circuit via a charge pump and a low-pass filter. By virtue of a suitable design for these components, it is possible to achieve a sufficiently high level of sensitivity for the trimming method.

To change the modulation swing in the analog modulation signal, the following steps are preferably carried out: the signal that is characteristic of the control error is compared with a reference signal having a fixed value, thus producing a comparison signal. The comparison signal is evaluated before and after the analog and digital modulation is impressed. The modulation swing in the analog modulation signal is changed on the basis of the evaluation result.

One advantageous exemplary embodiment of the inventive method is characterized in that the reference signal is provided by adjusting (i.e. programming) the PLL circuit in the deactivated state to a desired channel center frequency, activating the PLL circuit and thereby locking it, and producing the reference signal from the signal that is characteristic of the control error in the PLL circuit during the locking process. In this exemplary embodiment, the reference signal required for trimming is to a certain extent produced using the PLL circuit itself.

An alternative exemplary embodiment, which is likewise advantageous, is characterized in that a prescribed reference signal is provided externally. The prescribed reference signal can be identical for all channel center frequencies, or it is also possible to provide a reference signal that is dependent on the desired channel center frequency.

The inventive PLL circuit has an associated trimming unit which includes a device for tapping a signal that is characteristic of the PLL control error from the PLL circuit and also a device for evaluating the signal that is characteristic of the control error and also a device for changing the modulation swing in the analog modulation signal on the basis of the evaluation result.

An inexpensive implementation, using simple circuitry, of the device for tapping the signal that is characteristic of the PLL control error from the PLL circuit includes a charge pump and a low-pass filter which is connected downstream of the charge pump.

The device for evaluating the characteristic signal preferably includes a device for comparing the signal that is characteristic of the control error with a reference signal having a fixed value, thus producing a comparison signal, and a device for evaluating the comparison signal before and after the analog and digital modulation is impressed. In this case, the reference signal should be chosen such that the comparison device (comparator) is operated in the range of maximum sensitivity.

Other features which are considered as characteristic for the invention are set forth in the appended claims.

Although the invention is illustrated and described herein as embodied in a trimming method and trimming device for a PLL circuit for two-point modulation, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
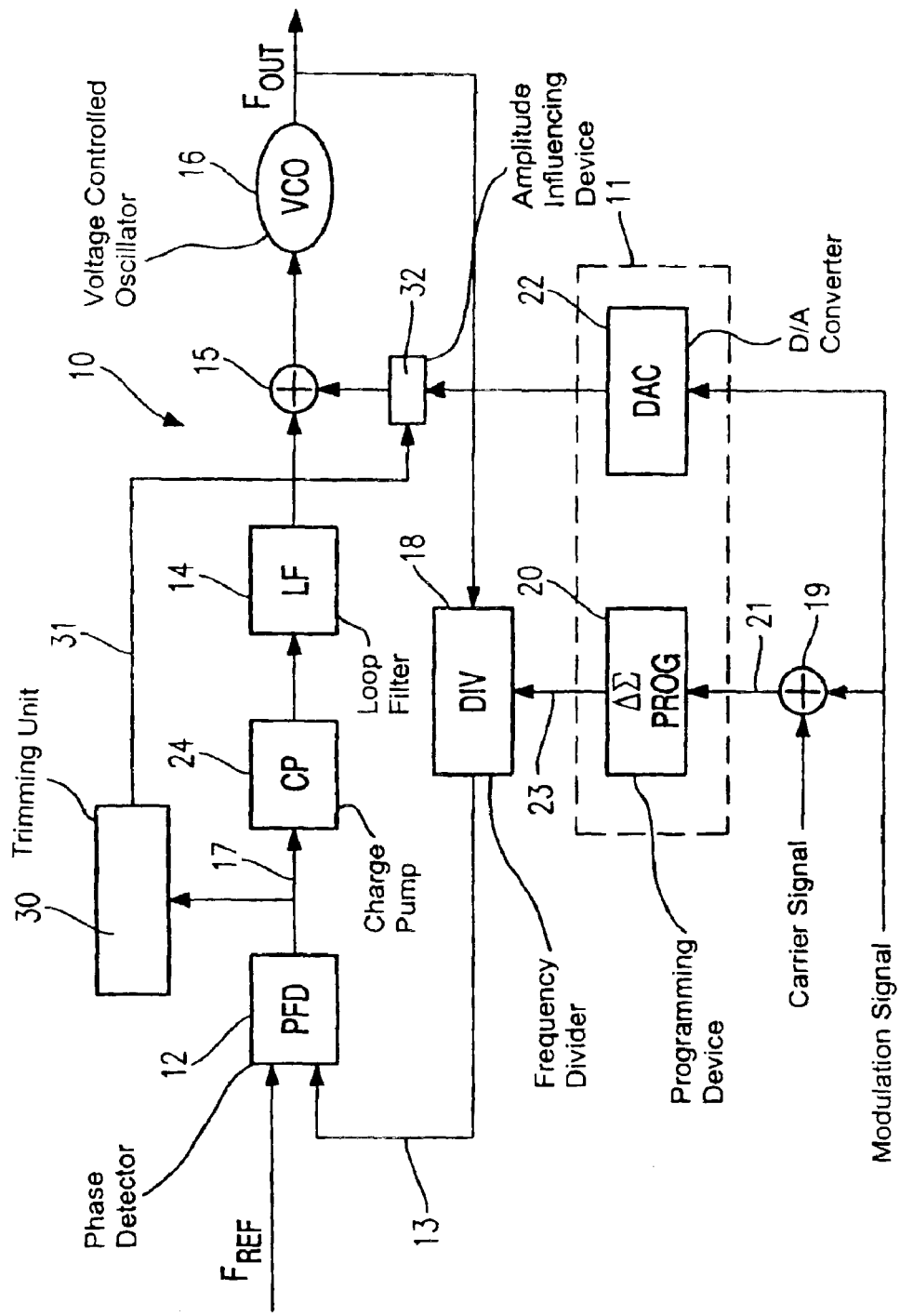
FIG. 1 is a block diagram of a PLL circuit arrangement which operates on the basis of the principle of two-point modulation and has a trimming unit in accordance with the invention.

Referring now to the figures of the drawing in detail and first, particularly, to FIG. 1 thereof, there is shown a PLL circuit 10 which operates on the basis of the principle of two-point modulation and is coupled to a trimming unit 30.

In line with an ordinary design, the signal path of the PLL circuit 10 has a phase detector PFD (Phase Frequency Detector) 12, a charge pump CP 24, a loop filter LF 14, a summation point 15 and a voltage-controlled oscillator VCO 16.

The VCO 16 is the element that produces oscillations in the PLL circuit 10 and delivers a signal of frequency $F_{OUT}$ as the output signal from the PLL circuit 10.

The PLL control loop 10 is closed by a feedback path that returns the output signal from the VCO 16 to the frequency detector 12 via a programmable frequency divider DIV 18.

The action of the PLL circuit as a frequency synthesizer for two-point modulation is known. Two-point modulation involves impressing a digital and an analog modulation signal on the PLL circuit 10. FIG. 1 shows an example of a modulation circuit 11 that is used to condition the two modulation signals and to supply them to the PLL circuit 10. The modulation circuit 11 shown here, by way of example, includes a programming device 20 and a digital-analog converter DAC 22. A modulation signal is added to a carrier signal, forming the basis of the PLL frequency synthesis, at a summation point 19, and the resultant added signal 21 is supplied to the programming device 20. In addition, the modulation signal is also supplied to the digital-analog converter 22.

The programming device 20, which can be a programming device 20 containing a sigma-delta modulator, for example, produces a control signal 23 that is supplied to the programmable frequency divider 18. The control signal 23 is a digital signal that specifies a division ratio 1:N. N is an integer and is subject to constant changes on account of the modulation signal, as a result of which the programmable frequency divider 18 is continually reprogrammed. The continual reprogramming of the frequency divider 18 impresses the digital modulation into the PLL circuit 10.

The frequency divider 18 can be a "fractional-N frequency divider", for example. Fractional-N frequency dividers allow frequency division by nonintegers also ("fractional synthesis technique"). The fractional synthesis technique is advantageous because the interference arising in the case of integer division as a result of lateral lines in the spectrum of the output signal are avoided.

Analog modulation is performed using the digital-analog converter 22 and the summation point 15. The digital-analog converter 22 produces an analog output signal that is superimposed on the control signal for the VCO 16 by the summation point 15.

It will be pointed out that the modulation circuit 11 can also be implemented in another way. By way of example, when an analog modulation signal is used, the digital-analog converter 22 can be dispensed with and instead a corresponding signal conversion can be performed in the digital modulation path. The only point of significance to the invention is that, for the two-point modulation, one of the modulation signals is an analog signal and the other modulation signal is a digital signal.

The way in which the PLL circuit works in the locked state is known and is explained briefly below:

The frequency divider DIV 18 outputs a frequency divider signal 13 that is produced from the output signal from the PLL circuit 10 in the manner already described by frequency division. The phase detector PFD 12 compares the phases with the two signals obtained and produces a control signal 17 that corresponds to the phase difference between the two signals obtained. The control signal 17 is used to actuate the charge pump CP 24. A current generated in the charge pump 24 on the basis of the control signal 17 is used to charge the loop filter LF 14. Since the loop filter LF 14 is a low-pass filter, signal components of relatively high frequency are smoothed in this manner. The output of the loop filter LF 14 is then used, after the addition of the analog modulation at the summation point 15, to control the oscillator 16.

Since the analog modulation signal is subject to drift and tolerances, unlike the digital modulation signal 23, which has no tolerances on account of its discrete nature, it is necessary to make the amplitudes of the two modulation signals more alike. For this purpose, the PLL circuit 10 is coupled to a trimming unit 30, whose operation and design will be explained in more detail below. The trimming unit 30 outputs a control signal 31 that is supplied to an amplitude influencing device 32 for influencing the amplitude of the analog modulation signal.

To give a better understanding, the principle of action of the two-point modulation technique will be explained briefly: during operation, impressing the modulation into the PLL control loop 12, 24, 14, 16, 18 must not involve any reaction to the modulation by the closed control loop. This is achieved by virtue of the analog modulation, which is impressed in analog form at the summation point 15, being compensated for by a correspondingly opposite change in the division factors of the frequency divider 18, prompted by the digital modulation. Hence, if the analog modulation increases the output frequency $F_{OUT}$ from the VCO, then the division factor simultaneously needs to be increased to the same extent (by the digital modulation), so that the output frequency from the frequency divider 18 (the frequency divider signal 13) remains unchanged by the modulation. Similarly, if the output frequency $F_{OUT}$ is lowered, the division factor needs to be lowered accordingly. That is to say that, if the analog and digital modulation swings concur exactly, the closed loop behaves like an open loop.

If the modulation swings do not concur, then the PLL control loop corrects the error. A measure of the inequality of the modulation swings is the voltage change which appears at the output of the loop filter LF 14 when the modulations are added. This voltage change is generally very small (a few mV), however. The invention is now based on the idea of using a parallel path to the same effect to make this voltage change available in an order of magnitude that is easier to evaluate (e.g. several 100 mV). In this case, the same conditions apply: no control action in the PLL control loop means no activity on the phase detector PFD 12 and hence no voltage change at the output of the parallel path.

Figure 2:
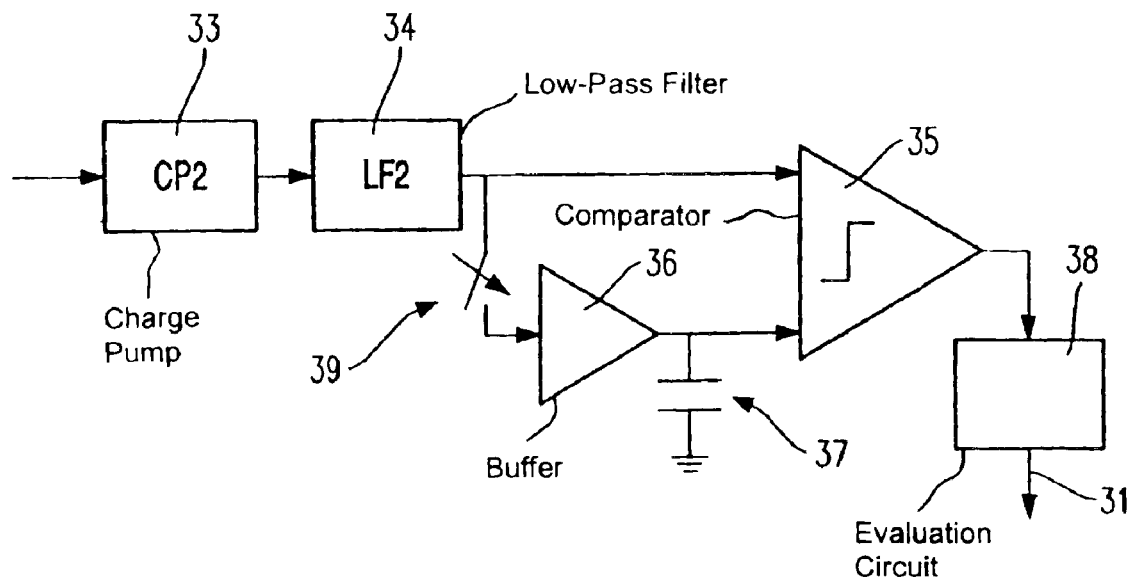
FIG. 2 is a block diagram of a first exemplary embodiment of the trimming unit shown in FIG. 1.

FIG. 2 shows a first exemplary embodiment of the inventive trimming unit 30. The trimming unit 30 includes a second charge pump CP2 33 and a second low-pass filter LF2 34, which is connected downstream of the second charge pump CP2. The second charge pump LF2 34 and the second low-pass filter 34 produce the parallel path mentioned above. The output of the low-pass filter LF2 34 is supplied to one of the inputs of a comparator 35. The other input of the comparator 35 is connected to the output of a buffer 36. A capacitor 37 is situated between the second comparator input and ground. An output of the comparator 35 is supplied to an evaluation circuit 38 which produces the control signal 31.

The inventive trimming unit 30 is used in the following manner to trim the modulation amplitudes:

First, the PLL circuit 10 is programmed to the desired channel center frequency before the transmission operation. This is done merely by adjusting the appropriate division factor N or the digital channel representation (e.g. a channel word when using a fractional-N sigma-delta programmer 20) on the frequency divider 18.

When the desired channel center frequency has been set, the PLL circuit 10 is turned on and locks onto the channel center frequency.

While the PLL circuit 10 is locking, the second low-pass filter LF2 34 is charged via the second charge pump CP2 33. A switch 39 which is closed during the locking process is used to supply the output signal from LF2 34 to the buffer 36. This involves the capacitor 37 arranged at the output of the buffer 36 being charged.

The charging of the capacitor 37 serves to produce a reference signal. When the PLL circuit 10 has locked, the switch 39 is opened. The result of this is that the voltage produced by charging the capacitor 37 is now applied to the second input of the comparator 35 as a constant reference voltage $V_{REF}$.

Next, a constant modulation (i.e. a "DC voltage test modulation") is impressed both in analog and in digital form for a particular period. As a result of the aforementioned amplitude error in the analog modulation (i.e. as a result of the erroneous analog modulation swing as compared with the digital modulation swing), the voltage which is output by the second low-pass filter LF2 will now change accordingly. The voltage at the output of the second low-pass filter LF2 is compared with the reference voltage in the comparator 35, and the comparison result is continually communicated to the evaluation circuit 38. The evaluation circuit 38 evaluates the comparison signal obtained from the comparator 35 and, in so doing, detects a change in the voltage which is output by the second low-pass filter LF2 (i.e. the evaluation circuit 38 compares the comparator comparison signal obtained following locking of the PLL but before the analog and digital modulations are applied with the comparator comparison signal obtained after the analog and digital modulations have been applied). The control signal 31 produced by the evaluation circuit 38 then uses the device 32 to prompt a change in the amplitude of the analog modulation swing or in the analog modulation signal such that the voltage difference appearing at the output of the second low-pass filter LF2 34 with respect to the voltage obtained in the preceding step (with no modulation) is eliminated.

The signal that is output by the comparator 35 can be evaluated in the evaluation circuit 38 using an iterative process. For example, i.e. the analog modulation amplitudes are approximately trimmed step by step with alternately updating the control signal 31 and assessing the resultant, changed output signal from the comparator 35. When the voltage change at the output of the low-pass filter LF2 has been eliminated, which voltage change occurred when the analog and digital modulations were added, the digital and analog modulation swings have been aligned.

Figure 3:
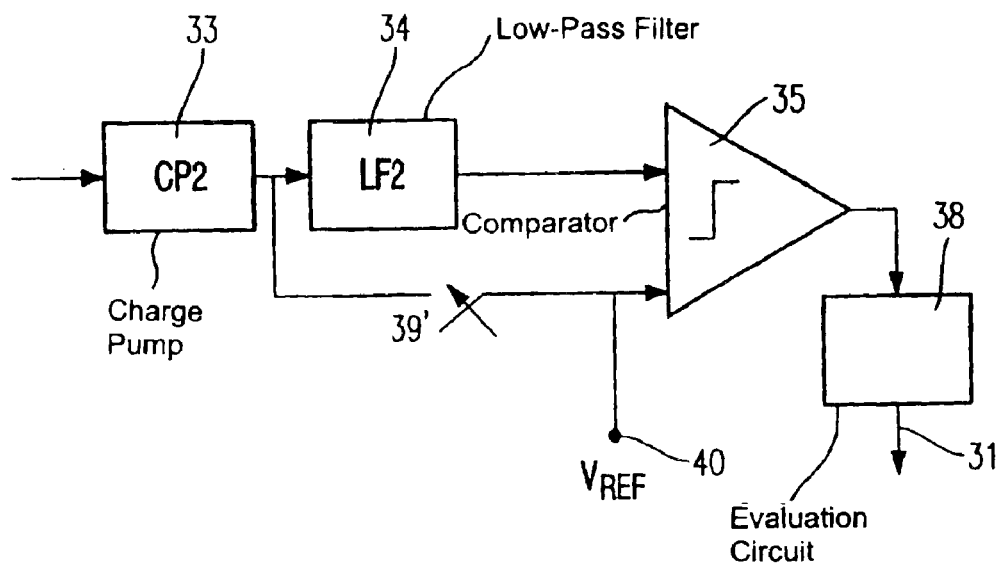
FIG. 3 is a block diagram of a second exemplary embodiment of the trimming unit shown in FIG. 1.

FIG. 3 shows a second exemplary embodiment of the trimming unit 30. Components that are the same or have the same function have been denoted using the same references as in FIG. 2. The trimming unit 30 again includes a second charge pump CP2 33, a second low-pass filter LF2 34, a comparator 35 and an evaluation circuit 38. In respect of these components, the circuit design of the second exemplary embodiment is identical to the circuit design of the first exemplary embodiment shown in FIG. 2. In addition, the circuit has a node 40 via which a prescribed external, fixed reference voltage $V_{REF}$ can be applied to the second comparator input. The external reference voltage $V_{REF}$ can also be applied to the input of the second low-pass filter LF2 34 via a switch 39'.

The circuit shown in FIG. 3 differs from the circuit shown in FIG. 2 essentially only in that the reference voltage for the comparator 35 is in this case not derived from the PLL's locking process but rather is produced externally. The modulation swing is trimmed in the following manner:

Either before the PLL circuit 10 is turned on or when the PLL circuit 10 has already been turned on and has locked, the second charge pump CP2 33 is deactivated and the switch 39' is closed. The result of this is that the second low-pass filter LF2 34 is charged solely using the reference voltage $V_{REF}$ (precharging), since the second charge pump CP2 33 has a high impedance in the deactivated state. The evaluation circuit 30 is thus decoupled from the PLL circuit 10 in this state.

Following charging of the low-pass filter LF2 34, setting of the channel center frequency and the locking process in the PLL circuit 10, which leaves the trimming unit 30 unaffected in this case, the switch 39' is opened. This fixes the reference voltage $V_{REF}$ applied to the second input of the comparator 35 (at least for the duration of the subsequent trimming). Next, the second charge pump CP2 33 is activated. The rest of the procedure corresponds to the method already explained with reference to FIG. 2 (impressing the constant analog and digital modulations, trimming the voltage difference arising in the process at the output of the low-pass filter 34 using the evaluation circuit 38 and the device 32 for influencing the amplitude of the analog modulation signal).

Both exemplary embodiments allow the constant reference voltage required at the second comparator input to be produced with little complexity and in a power-saving manner. In the second exemplary embodiment, the reference voltage used can be the supply or bandgap voltage which is present anyway, for example. In this case, the reference voltage should be in the range of maximum sensitivity of the comparator 35 as far as possible.

Figure 4:
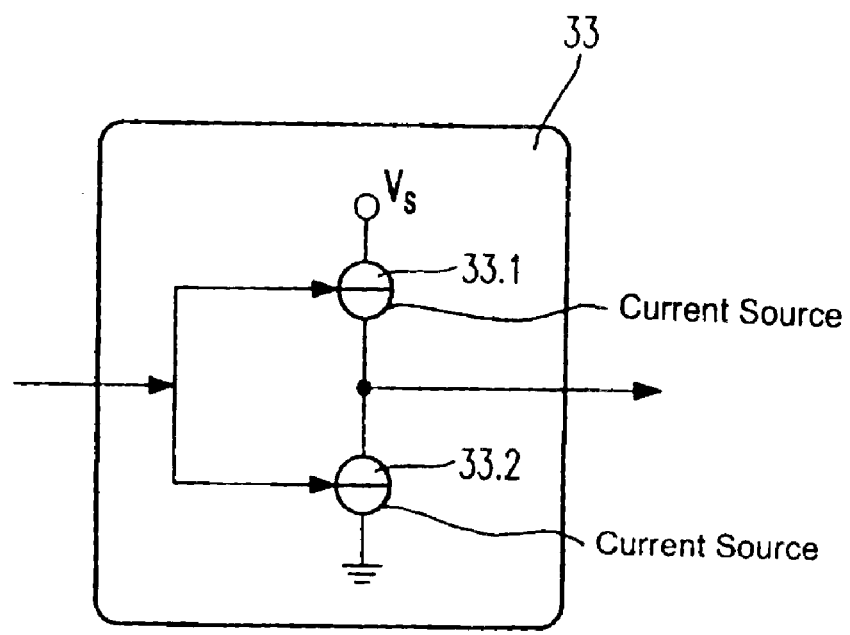
FIG. 4 is a block diagram of a charge pump used in the trimming unit.

FIG. 4 shows one possible implementation of the second charge pump CP2 33. The second charge pump CP2 33 includes two controllable current sources 33.1 and 33.2 which are connected in series between an operating voltage $V_S$ and ground. The two controllable current sources 33.1, 33.2 are usually single transistors or multi-transistor circuits. The current sources 33.1, 33.2 are controllable by means of an input signal which in the present case is the control signal 17 provided by the control error in the PLL circuit. The charge pump can also be actuated by providing two control signals ("up" and "down" signals) which are output directly by a phase detector of appropriate design. The output of the second charge pump 33 shown in this case branches off at the connection between the two current sources 33.1 and 33.2.

Figure 5:
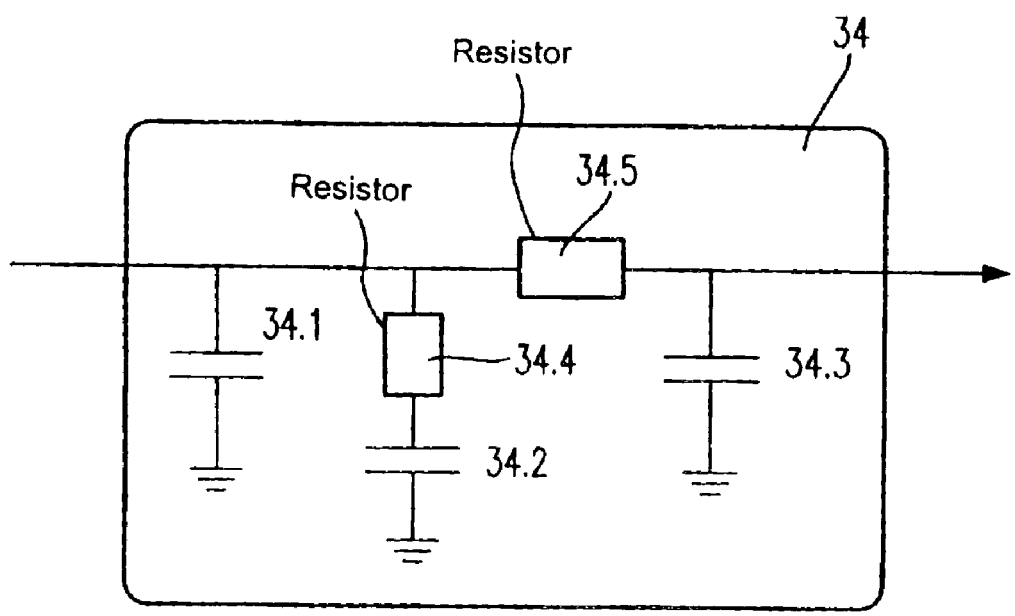
FIG. 5 is a block diagram of a circuit diagram of a low-pass filter used in the trimming unit.

FIG. 5 shows a circuit example for the second low-pass filter LF2 34. As in the circuit example shown in FIG. 4, it is possible to use a multiplicity of other circuits.

The low-pass filter 34 includes three capacitors 34.1, 34.2 and 34.3 which—in the case of the capacitor 34.2 via a resistor 34.4—can be charged via the filter input. The signal path contains a resistor 34.5.

In summary, it can be stated that the two exemplary embodiments are largely comparable up to the feature of providing the reference voltage $V_{REF}$, and their common action is based on the fact that, in the event of an amplitude difference between the two modulations, the phase detector PFD 12 establishes a control error which is picked up by the trimming unit 30, is conditioned in a suitable manner and is utilized for amplitude trimming.

We claim:

1. A method for amplitude trimming between an analog modulation signal and a digital modulation signal for a PLL circuit operating based on a two-point modulation, the method which comprises:

locking the PLL circuit onto a desired carrier frequency without impressing any modulation;

impressing the analog modulation signal into the PLL circuit, which is locked, via a summation point connected to an input of a voltage-controlled oscillator and impressing the digital modulation signal into a frequency divider configured in a feedback path of the PLL circuit resulting in a PLL control error;

obtaining a signal that is characteristic of the PLL control error from the PLL circuit; and changing a modulation swing in the analog modulation signal such that the signal that is characteristic of the PLL control error has a value that is the same as a value of the signal that is characteristic of the PLL control error before the analog modulation signal and the digital modulation signal were impressed.

2. The method according to claim 1, wherein the signal that is characteristic of the PLL control error in the PLL circuit is a voltage signal obtained from the PLL circuit via a charge pump and a low-pass filter.

3. The method according to claim 1, which further comprises:

obtaining a comparison signal by comparing the signal that is characteristic of the PLL control error with a reference signal having a fixed value;

obtaining an evaluation result by evaluating the comparison signal before and after performing the step of impressing the analog modulation signal and the digital modulation signal; and performing the step of changing the modulation swing in the analog modulation signal based on the evaluation result.

4. The method according to claim 3, which comprises obtaining the reference signal by:

adjusting the PLL circuit in a deactivated state to a desired channel center frequency;

activating the PLL circuit and thereby locking the PLL circuit; and producing the reference signal from the signal that is characteristic of a control error in the PLL circuit while the PLL circuit is being locked.

5. The method according to claim 3, wherein the reference signal is a prescribed external reference signal.

6. A PLL circuit designed for impressing an analog modulation signal and a digital modulation signal based on a two-point modulation, the circuit comprising:

a summation point having an output and an input for obtaining the analog modulation signal;

a voltage-controlled oscillator having an input connected to said output of said summation point;

a feedback path;

a frequency divider configured in said feedback path, said frequency divider obtaining the digital modulation signal; and an associated trimming device including:
- a device for tapping a signal being characteristic of a PLL control error,
- a device for obtaining an evaluation result by evaluating the signal being characteristic of a PLL control error, said device having a comparator for comparing the signal being characteristic of the PLL control error arising before the analog modulation signal and the digital modulation signal are impressed with the signal being characteristic of the PLL control error arising after the analog modulation signal and the digital modulation signal are impressed, and
- a device for changing a modulation swing in the analog modulation signal based on the evaluation result.

7. The PLL circuit according to claim 6, wherein said device for tapping the signal being characteristic of the PLL control error includes a charge pump and a low-pass filter connected downstream from said charge pump.

8. The PLL circuit according to claim 6, wherein said device for obtaining an evaluation result by evaluating the signal being characteristic of a PLL control error includes:

- a device for comparing the signal being characteristic of the control error with a reference signal having a fixed value, thus producing a comparison signal, and
- a device for evaluating the comparison signal before and after the analog modulation signal and the digital modulation signal are impressed.

9. The PLL circuit according to claim 8, further comprising a switching device configured such that said device for tapping the signal being characteristic of the PLL control error produces the reference signal during a locking process in the PLL circuit.

* * * * *